(12) United States Patent
Nagata

(10) Patent No.: US 10,229,720 B2
(45) Date of Patent: Mar. 12, 2019

(54) DISK APPARATUS

(71) Applicant: KABUSHIKI KAISHA TOSHIBA, Tokyo (JP)

(72) Inventor: Hiroshi Nagata, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/694,720

(22) Filed: Sep. 1, 2017

(65) Prior Publication Data

US 2018/0277169 A1    Sep. 27, 2018

(30) Foreign Application Priority Data

Mar. 23, 2017  (JP) .................. 2017-057089

(51) Int. Cl.

| | |
|---|---|
| *G11B 33/12* | (2006.01) |
| *G11B 21/22* | (2006.01) |
| *G11B 19/20* | (2006.01) |
| *G11B 33/08* | (2006.01) |
| *G11B 5/48* | (2006.01) |
| *G11B 25/04* | (2006.01) |
| *G11B 33/14* | (2006.01) |
| *G11B 5/54* | (2006.01) |
| *H05K 3/36* | (2006.01) |

(52) U.S. Cl.
CPC ............ *G11B 33/124* (2013.01); *G11B 5/486* (2013.01); *G11B 5/54* (2013.01); *G11B 19/20* (2013.01); *G11B 21/22* (2013.01); *G11B 25/043* (2013.01); *G11B 33/08* (2013.01); *G11B 33/1466* (2013.01); *G11B 33/1493* (2013.01); *H05K 3/363* (2013.01)

(58) Field of Classification Search
USPC .................. 360/99.15, 99.16, 99.18, 99.2
See application file for complete search history.

(56) References Cited

U.S. PATENT DOCUMENTS

| | | | | |
|---|---|---|---|---|
| 5,877,915 A | * | 3/1999 | Ishida | G11B 33/08 360/99.18 |
| 6,631,049 B2 | * | 10/2003 | Satoh | G11B 25/043 277/632 |

(Continued)

FOREIGN PATENT DOCUMENTS

| | | | |
|---|---|---|---|
| JP | 62279586 A | * | 12/1987 |
| JP | 62279587 A | * | 12/1987 |

(Continued)

*Primary Examiner* — William J Klimowicz
(74) *Attorney, Agent, or Firm* — Kim & Stewart LLP

(57) ABSTRACT

A disk apparatus includes a base including a bottom wall and a sidewall disposed along a peripheral portion of the bottom wall, a cover including a ceiling plate and a side plate disposed along a periphery of the ceiling plate, the ceiling plate being fixed to the sidewall and the side plate facing an outer surface of the sidewall, and a rotatable recording medium disposed between the cover and the bottom wall. The sidewall of the base includes a first portion adjacent to the recording medium and a protruding portion that protrudes from the first portion outward and away from the recording medium, and at least a portion of a sidewall of the protruding portion faces an opening formed in the side plate.

20 Claims, 11 Drawing Sheets

(56) References Cited

U.S. PATENT DOCUMENTS

| | | | |
|---|---|---|---|
| 2002/0109938 A1* | 8/2002 | Daniel | G11B 25/043 |
| | | | 360/99.16 |
| 2011/0273827 A1 | 11/2011 | Kasai et al. | |
| 2017/0263290 A1* | 9/2017 | Uehara | G11B 33/1466 |
| 2017/0294215 A1* | 10/2017 | Yamasaki | G11B 33/027 |

FOREIGN PATENT DOCUMENTS

| | | | | |
|---|---|---|---|---|
| JP | S63-087698 U | | 6/1988 | |
| JP | H10-144069 A | | 5/1998 | |
| JP | 2003132656 A | * | 5/2003 | G11B 33/08 |
| JP | 2016171717 A | * | 9/2016 | G11B 19/2009 |

\* cited by examiner

DISK APPARATUS

CROSS-REFERENCE TO RELATED APPLICATION

This application is based upon and claims the benefit of priority from Japanese Patent Application No. 2017-057089, filed Mar. 23, 2017, the entire contents of which are incorporated herein by reference.

FIELD

Embodiments described herein relate generally to a disk apparatus.

BACKGROUND

A hard disk drive (HDD) that functions as a disk apparatus includes a rectangular casing, a disk-like recording medium disposed within this casing, and a magnetic head disposed within the casing for reading or writing data from or to the recording medium. The casing includes a rectangular base, a plate-like top cover screwed onto the base, and a packing member (e.g., gasket) disposed between a peripheral portion of the base and the top cover.

In such an HDD, a portion of a sidewall of the base which is adjacent to the magnetic disk is made thinner due to a dimensional restriction. An HDD having a large height, in particular, has a sidewall that is thin and high. Owing to this, when the base that has such a sidewall is aluminum or the like, reliably forming the sidewall via die cast molding is difficult. Furthermore, in the portion of the sidewall that is thinner in wall thickness, it is difficult to sufficiently secure a width of a surface in contact with the gasket, which can make formation of an airtight seal problematic.

DETAILED DESCRIPTION

Figure 1:
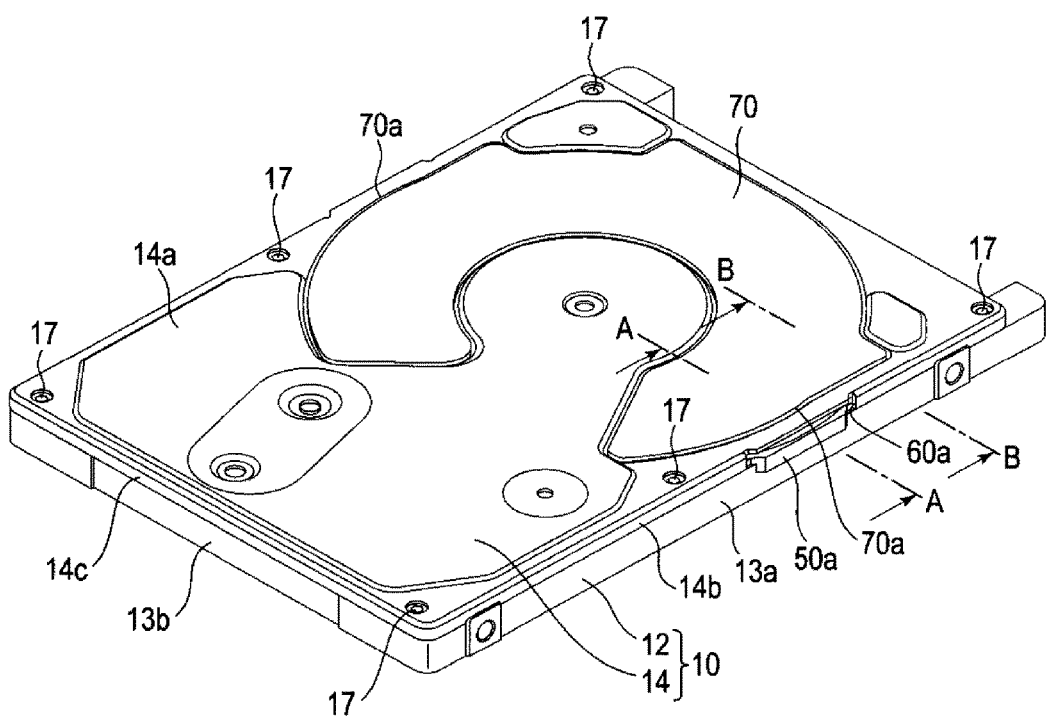
FIG. 1 is a perspective view illustrating a hard disk drive (HDD) according to a first embodiment.

Embodiments provide a disk apparatus with improved airtightness that includes a robust contact area with a sealing member.

In general, according to one embodiment, a disk apparatus includes a base including a bottom wall and a sidewall disposed along a peripheral portion of the bottom wall, a cover including a ceiling plate and a side plate disposed along a periphery of the ceiling plate, the ceiling plate being fixed to the sidewall and the side plate facing an outer surface of the sidewall, and a rotatable recording medium disposed between the cover and the bottom wall. The sidewall of the base includes a first portion adjacent to the recording medium and a protruding portion that protrudes from the first portion outward and away from the recording medium, and at least a portion of a sidewall of the protruding portion faces an opening formed in the side plate.

Disk apparatuses according to embodiments will be described hereinafter with reference to the drawings.

It is noted that the disclosure is presented by way of example only and matters which can be changed as appropriate without departing from the spirit of the disclosure and which could easily be conceived of fall within the scope of the present disclosure. Moreover, for clarity of description, in the drawings, constituent elements are often illustrated schematically in widths, thicknesses, shapes, and the like, and are not necessarily shown to scale. Further, the drawings are presented by way of example only and are not intended to limit the reading of the present disclosure. Furthermore, in the specification and the drawings, similar elements to those already described with reference to the drawings already described are denoted by the same reference signs and are often not described in detail, as appropriate.

First Embodiment

A hard disk drive (HDD) serving as a disk apparatus according to a first embodiment will be described in detail.

Figure 2:
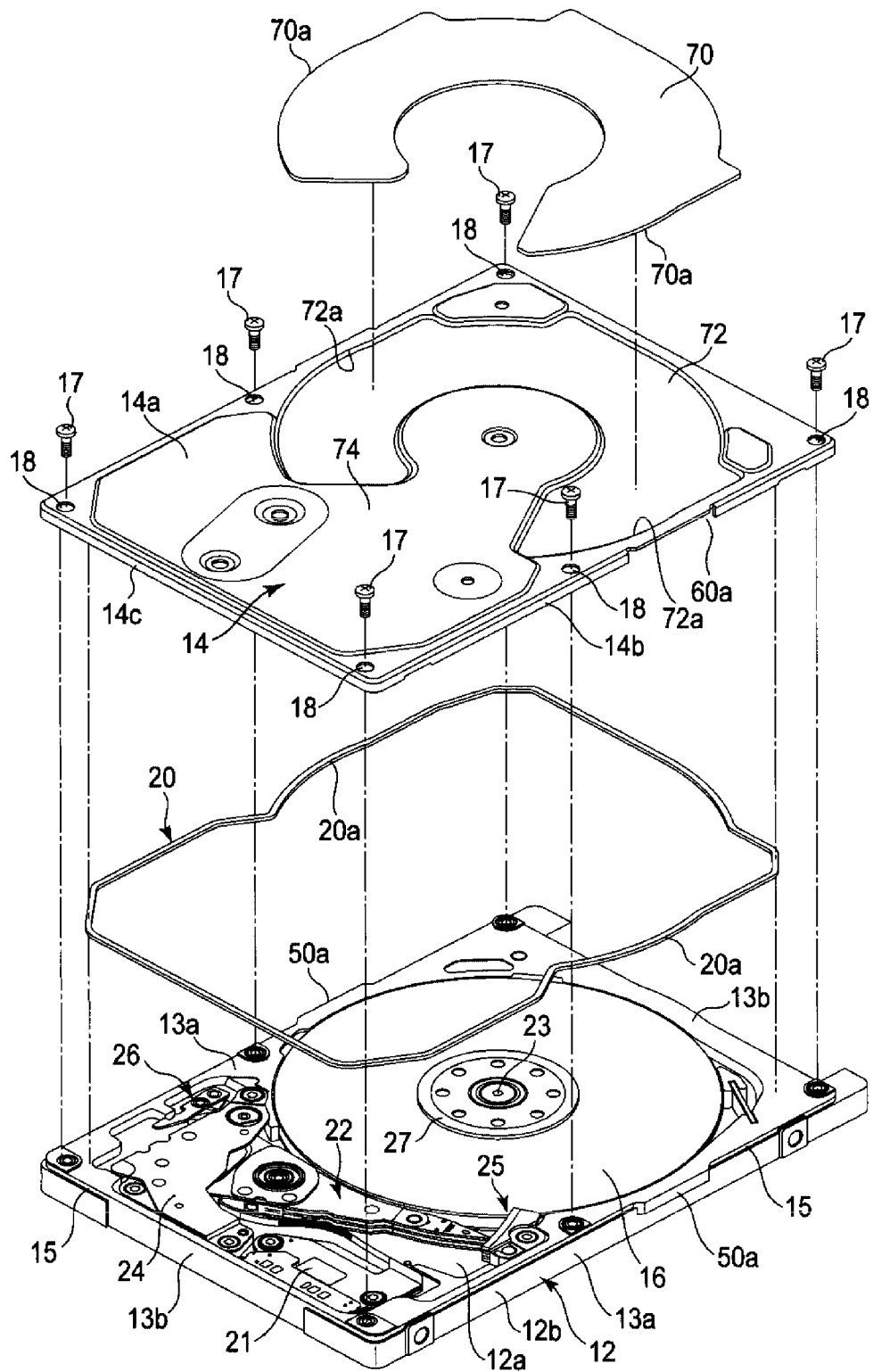
FIG. 2 is an exploded perspective view of the HDD.

FIG. 1 is a perspective view illustrating the HDD according to the first embodiment, and FIG. 2 is an exploded perspective view illustrating the HDD in an exploded fashion.

In the present embodiment, an example of a 2.5-inch HDD that includes a magnetic disk at a diameter of about 2.5 inches (63.5 mm) is described. As shown in FIGS. 1 and 2, the HDD includes a flat and rectangular casing 10. The casing 10 includes a rectangular box-like base 12 having an open upper surface and a rectangular plate-like top cover 14. The top cover 14 is screwed on the base 12 by a plurality of screws 17 to close an upper opening of the base 12. Furthermore, a damper 70 configured with a metal plate is bonded onto the top cover 14.

The base 12 includes a rectangular bottom wall 12a and a sidewall 12b located along a periphery of the bottom wall 12a, and the bottom wall 12a and the sidewall 12b are formed integrally from a metallic material such as aluminum or stainless steel. The sidewall 12b of the base includes a pair of long side walls 13a facing each other and a pair of short side walls 13b facing each other. An accommodation groove 15 is formed in an upper surface of an edge portion of the sidewall 12b, and can be a groove, notch or other indentation. In some embodiments, accommodation groove 15 is formed over the entire periphery of the sidewall 12b.

The top cover 14 is formed into a rectangular lid shape generally identical in dimension to the bottom wall 12a of the base 12 by stamping a metal plate at a thickness of, for example, 0.45 mm. The top cover 14 includes a rectangular ceiling plate 14a, and a pair of long side plates 14b and a pair of short side plates 14c, each formed by bending a corresponding side edge portion of the ceiling plate 14a toward the base 12, generally at a right angle. In some embodiments, the side plates 14b and 14c are each formed to have a height equal to or less than half a height of the sidewall 12b of the base 12.

Through-holes 18 are formed at the four corner portions of the ceiling plate 14a and at a position slightly offset from a centerpoint of each long side plate 14b. The top cover 14 is fastened to the sidewall 12b of the base 12 via the screws 17 that are inserted into the through-holes 18 and threaded into screw holes formed in the sidewall 12b of the base 12. That is, the top cover 14 is screwed on both end portions, in a longitudinal direction, of the short side walls 13b and generally central portions, in a longitudinal direction, of the long side walls 13a of the base 12 by the screws 17. The long side plates 14b and the short side plates 14c of the top cover 14 are disposed within the accommodation groove 15 of the sidewall 12b.

Figure 3A:
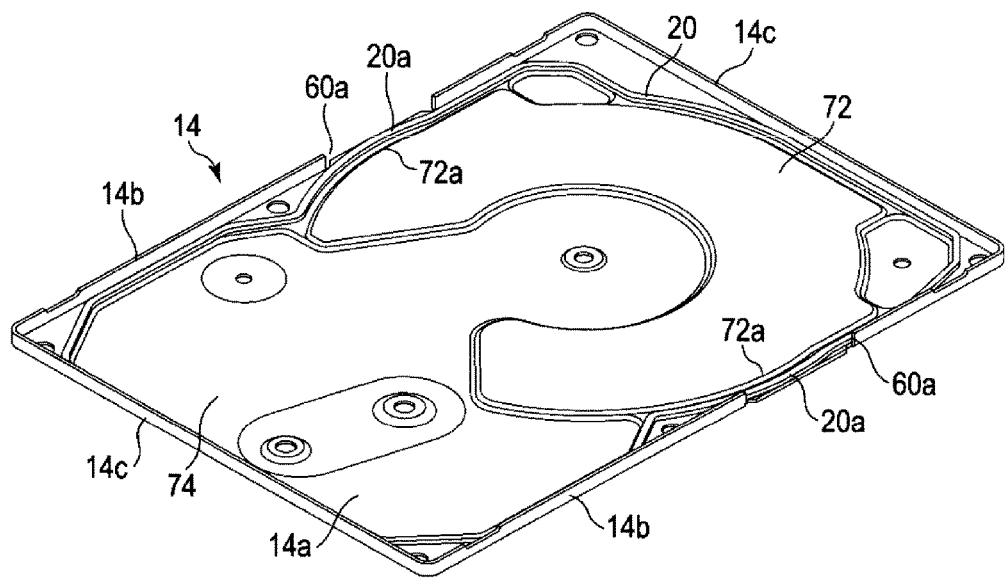
FIG. 3A is a perspective view illustrating a rear surface side of a top cover of the HDD.
Figure 3B:
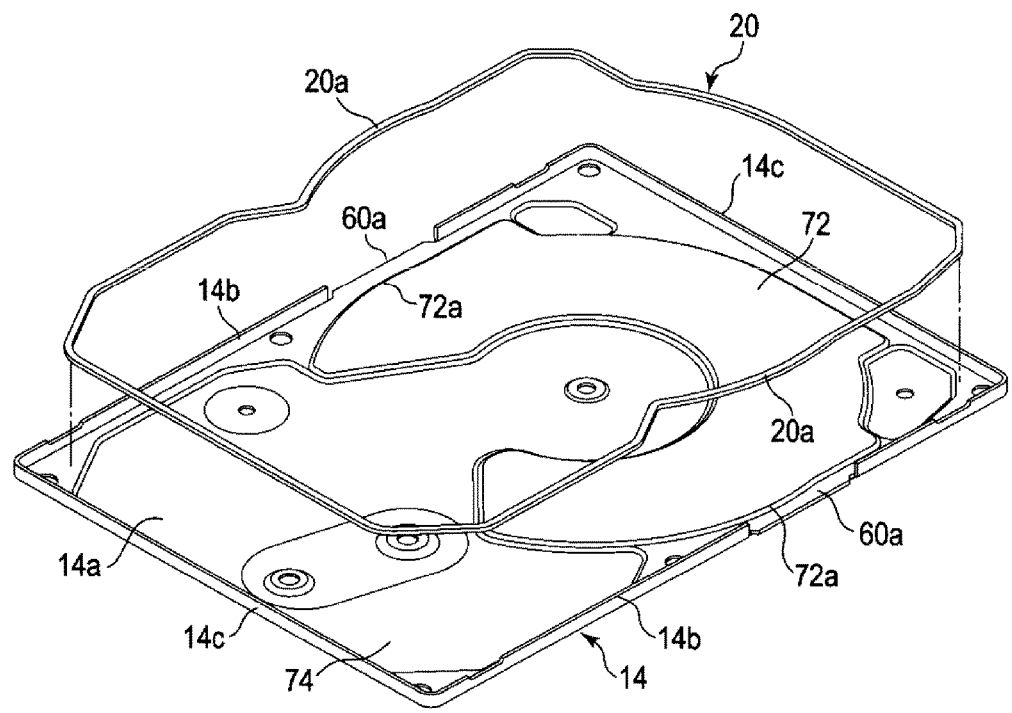
FIG. 3B is an exploded perspective view illustrating the top cover and a gasket.

FIG. 3A is a perspective view illustrating an inner surface side of the top cover 14, and FIG. 3B is an exploded perspective view illustrating the top cover 14 and a gasket 20.

Figure 4:
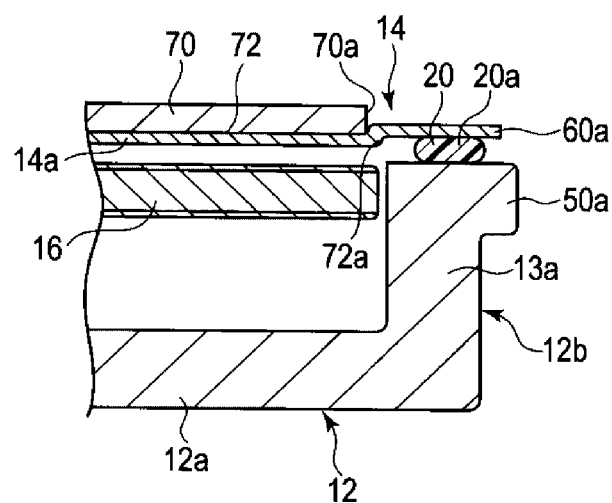
FIG. 4 is a cross-sectional view of the HDD taken along a line A-A of FIG. 1.
Figure 5:
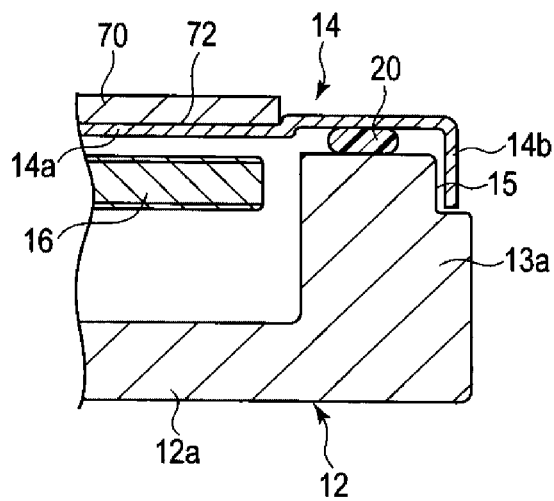
FIG. 5 is a cross-sectional view of the HDD taken along a line B-B of FIG. 1.

As shown in FIGS. 2, 3A, and 3B, the frame-like gasket (which is one type of packing member or sealing member) 20 is sandwiched between the upper end surface of the sidewall 12b of the base 12 and an inner surface of the ceiling plate 14a of the top cover 14. This gasket 20 is formed from, for example, a synthetic resin, and coated or adhesively bonded onto an inner surface of the top cover 14. A thickness of the gasket 20 is larger than a gap between the top cover 14 and the base 12. FIG. 4 is a cross-sectional view of the HDD taken along a line A-A of FIG. 1, and FIG. 5 is a cross-sectional view of the HDD taken along a line B-B of FIG. 1. As shown in FIGS. 4 and 5, when the top cover 14 is screwed on the base 12, the gasket 20 is sandwiched between the top cover 14 and the sidewall 12b of the base 12 and compressed therebetween to maintain airtightness within the casing 10.

Figure 6:
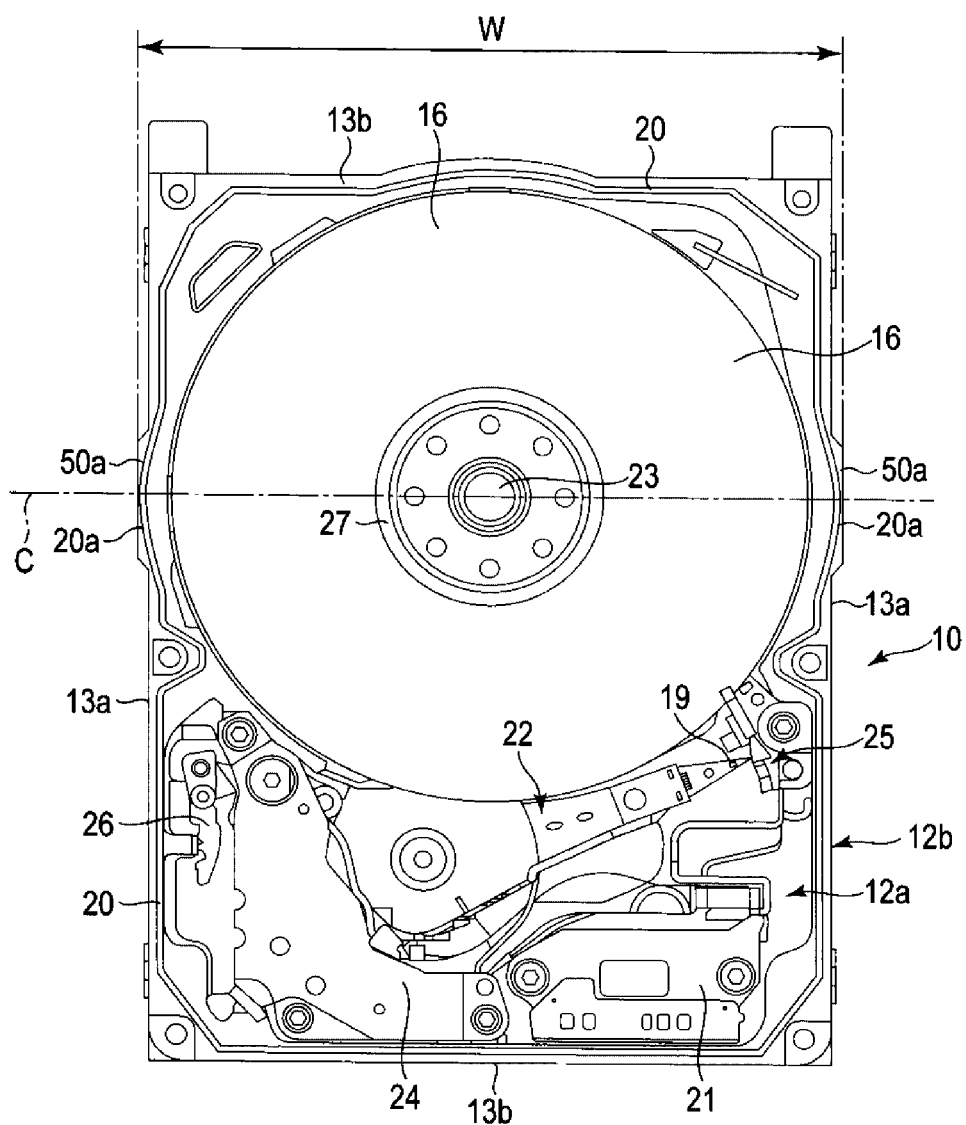
FIG. 6 is a plan view of the HDD illustrating an internal structure of the HDD.

FIG. 6 is a plan view of the HDD illustrating an internal structure of the HDD. As shown in FIGS. 2 and 6, a recording medium which is, for example, one magnetic disk 16, and a spindle motor 23 serving as a drive unit that supports and rotates the magnetic disk 16 are disposed within the casing 10. The spindle motor 23 is provided on the bottom wall 12a. The magnetic disk 16 has, for example, a diameter of about 2.5 inches (63.5 mm) and has a magnetic recording layer on each of an upper surface and a lower surface. It is assumed that the 2.5-inch magnetic disk is not limited to the magnetic disk having a diameter of 63.5 mm but may include a magnetic disk at a diameter of 65 mm or more. The magnetic disk 16 is coaxially fitted into a hub (not shown) of the spindle motor 23, clamped by a clamp spring 27, and fixed to the hub. The magnetic disk 16 is thereby positioned to be parallel to the bottom wall 12a of the base 12. The magnetic disk 16 is rotated at a predetermined velocity by the spindle motor 23. Furthermore, within the casing 10, the magnetic disk 16 is positioned to be offset from the center of the base 12, in the longitudinal direction, toward one of the short side walls 13b. The magnetic disk 16 is consequently closer to one of the short side walls 13b than to the other short side wall 13b.

Also disposed within the casing 10 is a plurality of magnetic heads 19 for reading or writing data from or to the magnetic disk 16 and a carriage assembly 22 supporting these magnetic heads 19 in such a manner that each magnetic head 19 is movable relative to the magnetic disk 16. Furthermore, also disposed within the casing 10 is a voice coil motor (hereinafter, referred to as "VCM") 24 for revolving and positioning the carriage assembly 22, a ramp load mechanism 25 for holding the magnetic head 19 at an unload position apart from the magnetic disk 16 when the magnetic head 19 moves to an outermost circumference of the magnetic disk 16, a latch mechanism 26 for holding the carriage assembly 22 at a retreat position when an impact or the like acts on the HDD, and a flexible printed circuit board (FPC) unit 21 mounting therein electronic components such as a conversion connector. The carriage assembly 22, the VCM 24, the ramp load mechanism 25, the latch mechanism 26, and the FPC unit 21 are disposed in a space between the magnetic disk 16 and the other short side wall 13b in the base 12.

According to the present embodiment, at least one long side wall 13a of the base 12 of the casing 10, or each of the two long side walls 13a, includes a first portion located adjacent to an outer peripheral portion of the magnetic disk 16 and a protruding portion 50a protruding or bulging from this first portion outward away from the magnetic disk 16. Each long side plate 14b of the top cover 14 includes a notch or an opening portion 60a (shown in FIGS. 7 and 9) that is aligned with and accommodates the protruding portion 50a.

Figure 7:
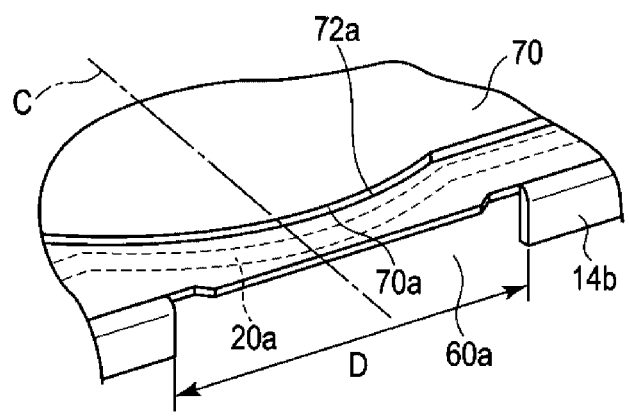
FIG. 7 is a perspective view illustrating a notch portion of the top cover in an enlarged fashion.
Figure 8:
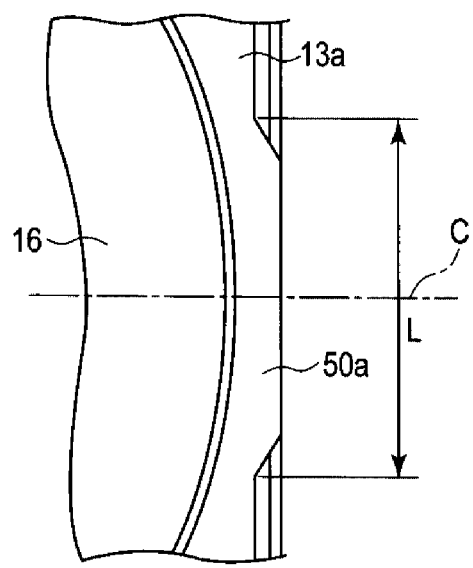
FIG. 8 is a plan view illustrating a protruding portion of a base of the HDD.
Figure 9:
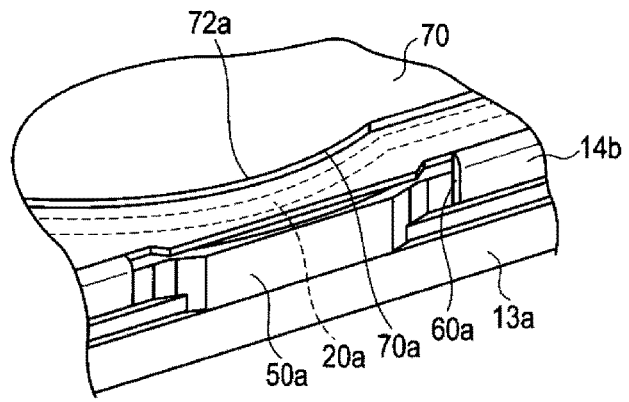
FIG. 9 is a perspective view illustrating a casing of the HDD in a partially enlarged fashion.

FIG. 7 is a perspective view illustrating the opening portion 60a of the top cover 14, FIG. 8 is a plan view illustrating a portion of the protruding portion 50a of the base 12, and FIG. 9 is a perspective view illustrating the protruding portion 50a and the opening portion 60a. As shown in FIGS. 1, 2, 6, and 8, each long side wall 13a of the base 12 includes the first portion that is adjacent to the outer peripheral portion of the magnetic disk 16 and the protruding portion 50a of the first portion that is disposed proximate the magnetic disk 16. In the present embodiment, "being adjacent" indicates a state in which the first portion faces the outer peripheral portion of the magnetic disk 16 with a small gap of about 1 mm present between the first portion and the outer peripheral portion thereof. The protruding portion 50a protrudes or bulges outward (away from the magnetic disk 16) from an outer side surface of the long side wall 13a. In a height direction of the long side wall 13a, The protruding portion 50a is disposed on an upper side of the long side wall 13a (i.e., on a side of long side wall 13a that is distal from the rectangular bottom wall 12a and proximal to the damper 70) and formed flush with an upper surface of the long side wall 13a. The protruding portion 50a is formed to have a thickness greater than the height of each long side plate 14b of the top cover 14. In some embodiments, the thickness of protruding portion 50a is also equal to or less than half a height of the long side wall 13a.

As described above, the base 12 is formed into a rectangular shape, and the longitudinal direction of the base 12 is parallel to the long side walls 13a and a width direction thereof is parallel to the short side walls 13b. As shown in FIGS. 6 and 8, the two protruding portions 50a disposed on the pair of long side walls 13a are each located at a position crossed by a straight line C that passes through a center of the magnetic disk 16 and is parallel to the short side walls 13b of the base 12. In the present embodiment, each protruding portion 50a is formed to extend or protrude outward from the magnetic disk 16 along the straight line C at an equal distance in each direction. A length L (shown in FIG.

8) of the protruding portion 50a along the longitudinal direction of the long side walls 13a is, for example, about 16 mm.

A bulging amount of each protruding portion 50a is set such that the protruding portion 50a extends beyond a long side edge of the ceiling plate 14a of the top cover 14, and a width W between the two protruding portions 50a (see FIG. 6) is the maximum width of the base 12 and set to be larger than a width of the top cover 14. It is noted that the width W is set within a range of an outer shape dimension standard (for example, SFF standard) of the HDD. In a case of the 2.5-inch HDD, the width W is set to 69.85±0.25 mm and the maximum width W of the base 12 is, therefore, set to be equal to or smaller than 70.1 mm.

The above-described configuration of the protruding portions 50a enables the upper end surface (i.e., the surface that contacts gasket 20) of each long side wall 13a in each of the protruding portions 50a to have a larger width, as shown in FIG. 4. The above-described configuration of the protruding portions 50a also enables the upper end surface to have the width set equal to or larger than that of other portions of the long side wall 13a.

As shown in FIGS. 2, 3A, 3B, 4, and 6, the gasket 20 includes curved portions 20a at positions respectively corresponding to the protruding portions 50a of the long side walls 13a, and therefore bent or curve outward along the protruding portions 50a. That is, each curved portion 20a is in contact with a respective protruding portion 50a. Therefore, the gasket 20 abuts on a central portion, in the width direction, of the upper end surface of the sidewall 12b, including in the protruding portions 50a of the sidewall 12b.

On the other hand, as shown in FIGS. 2, 3A, 3B, and 7, the notches or opening portions 60a formed in the long side plates 14b of the top cover 14 are located at positions corresponding to the two protruding portions 50a, respectively. That is, the two notches or opening portions 60a are each located at the position crossing the straight line C passing through the center of the magnetic disk 16 and parallel to the short side walls 13b of the base 12. Each notch or opening portion 60a is formed to extend away longitudinally from the straight line C in both directions equally, so that the straight line C passes through a center portion of each opening portion 60a. A length D of each opening portion 60a along the longitudinal direction of the long side walls 13a is formed to be equal to or smaller than 20 mm (D≤20 mm), for example 16 mm, while a height of the opening portion 60a is equal to the height of the long side plates 14b.

As shown in FIGS. 1 and 9, in a state of screwing the top cover 14 on the sidewall 12b of the base 12, each of the protruding portions 50a of the base 12 is accommodated in the opening portion 60a of each of the long side plates 14b of the top cover 14, and extends outward through the opening portion 60a in the long side plate 14b. That is, the long side plate 14b of the top cover 14 faces the sidewall 12b except for the protruding portion 50a. At the same time, as shown in FIG. 4, the gasket 20 is sandwiched between the ceiling plate 14a of the top cover 14 and the upper end surface of the sidewall 12b and therefore is compressed between in the protruding portions 50a and the upper end surface of the sidewall 12b to maintain airtightness along the protruding portion 50a.

In the HDD configured as described above, as the length D of each notch or opening portion 60a of the top cover 14 is set larger, then rigidity of the top cover 14 degrades and the top cover 14 is prone to bulge by a reaction force generated during compression of the gasket 20. Owing to this, a substantial gasket compressibility degrades. According to a simulation, when the length D of the opening portion 60a exceeds 20 mm, then an actual gasket compression amount becomes equal to or smaller than half a desired gasket compression amount, and the airtightness ensured by the gasket is impaired. It is, therefore, preferable that the length D of the opening portion 60a of the top cover 14 satisfies D≤20 mm. In the present embodiment, the length D is set to satisfy D=16 mm as described above. Moreover, the width of the base 12 is increased within a range not exceeding the outer shape dimension standard of the 2.5-inch HDD in conformity to the opening portion 60a.

According to the present embodiment, the HDD includes the damper 70 provided on the top cover 14 as shown in FIGS. 1 and 2. The damper 70 is configured with the metal plate such as a stainless steel plate. The damper 70 is formed into a circular arc shape or a C-shape. The damper 70 is thicker than the top cover 14.

As shown in FIGS. 2 to 4, the ceiling plate 14a of the top cover 14 includes a first recess portion 72 recessed toward the base 12 and having a circular arc shape or a generally C-shape, and a second projecting portion 74 protruding in a direction away from the base 12. The first recess portion 72 and the second projecting portion 74 can be formed simultaneously when the top cover 14 is pressed or stamped into shape. Except for a region facing a central portion of the spindle motor 23, the first recess portion 72 is formed to surround this central portion. Furthermore, the first recess portion 72 is formed in a region facing a surface of the magnetic disk 16 except for a moving path of each magnetic head 19. Providing such a first recess portion 72 can reduce the size of a gap between the top cover 14 and the surface of the magnetic disk 16. Moreover, the second projecting portion 74 is formed in a region facing a central portion of the magnetic disk 16, the moving path of each magnetic head 19, the carriage assembly 22, the VCM 24, the ramp load mechanism 25, the latch mechanism 26, and the like.

The damper 70 has a shape that is identical or similar to that of the first recess portion 72 and is disposed within the first recess portion 72. The damper is bonded onto the top cover 14 by, for example, adhesive. The damper 70 is disposed to face the surface of the magnetic disk 16. The damper 70 reinforces the top cover 14 and acts to damp a vibration of the top cover 14 resulting from rotation of the magnetic disk 16.

In the present embodiment, the damper 70 includes a pair of side edge portions 70a located adjacent to the opening portions 60a of the top cover 14, respectively. Likewise, the first recess position 72 includes a pair of bent side edge portions (or stepped portions) 72a located adjacent to the opening portions 60a of the top cover 14, respectively. As shown in FIGS. 1 to 3A, 4, 7, and 9, the side edge portions 70a and the drawn side edge portions 72a of the first recess portion 72 of the damper 70 are adjacent to the gasket 20 and extend generally in parallel to the gasket 20. In the present embodiment, regions of the side edge portions 70a and the bent side edge portions 72a, which face the curved portions 20a of the gasket 20, are each formed into a circular arc shape that is concentric with each curved portion 20a. The damper 70 and the bent side edge portions 72a reinforce regions including the opening portions 60a of the top cover 14.

The HDD configured as described so far is capable of increasing the width of each thin wall portion of the sidewall 12b of the base 12 to nearly an upper limit of a restriction on an apparatus outer shape dimension and thereby increase the thickness of the sidewall 12b by providing the protruding portions 50a in the thin wall portion thereof. Furthermore, forming the protruding portions 50a by machining can reduce a dimensional tolerance, so that it is possible to expect further increase in the thickness of the sidewall 12b. Increasing the thickness of the sidewall 12b can contribute to improving castability of the base 12. Moreover, the width of a contact surface (upper end surface of the sidewall 12b) with the gasket 20 increases and a contact area with the gasket 20 increases, so that it is possible to improve the airtightness of the casing 10. Further, in the present embodiment, three screw holes are formed in each long side wall 13a of the base 12, and a distance between the central screw hole and the screw hole formed in the end portion of the long side wall 13a in the longitudinal direction and closer to the magnetic disk 16 is larger than the distance between the central screw hole and the screw hole formed in the end portion of the long side wall 13a in the longitudinal direction and closer to the carriage assembly 22. The protruding portion 50a of each long side wall 13a is disposed between the screw holes separated by the larger distance, so the protruding portions 50a enable improved airtightness of a region between these more widely separated screw holes.

Furthermore, bonding the damper 70 onto the top cover 14 can increase a mechanical strength of the top cover 14, and it is possible for the damper 70 to reinforce, in particular, the strength of the top cover 14 that may be reduced by the presence the opening portions 60a. According to the present embodiment, providing the side edge portions 70a of the damper 70 and the drawn side edge portions 72a of the first recess portion 72 of the ceiling plate 14a of the top cover 14 near the respective opening portions 60 can increase the mechanical strength of the top cover 14 around the opening portions 60a. Owing to this, when the gasket 20 is sandwiched between the top cover 14 and the base 12, it is possible to prevent or reduce deformation of the top cover 14 by the reaction force of the gasket 20, ensuring hermeticity of the casing 10.

In light of the foregoing, according to the present embodiment, it is possible to obtain a hard disk drive that has a sufficiently robust contact area between the gasket and the casing that improves the airtightness of the casing.

In the first embodiment, the shape of the damper 70 is not limited to that described above and various other shapes are applicable as the shape of the damper 70. The number of the magnetic disks 16 is not limited to one and can be increased as needed.

HDDs according to other embodiments will next be described. In the other embodiments described below, the same constituent elements as those in the above-mentioned first embodiment are denoted by the same reference numbers and are not described in detail or are briefly described, and constituent elements different from those in the first embodiment will be mainly described.

Second Embodiment

Figure 10:
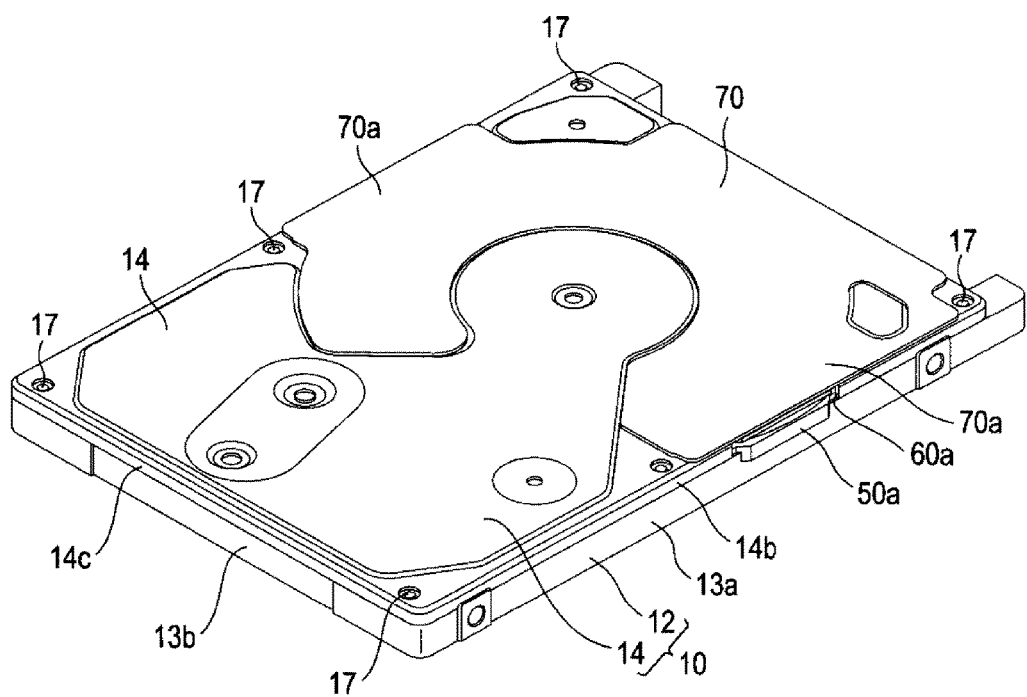
FIG. 10 is a perspective view illustrating an HDD according to a second embodiment.
Figure 11:
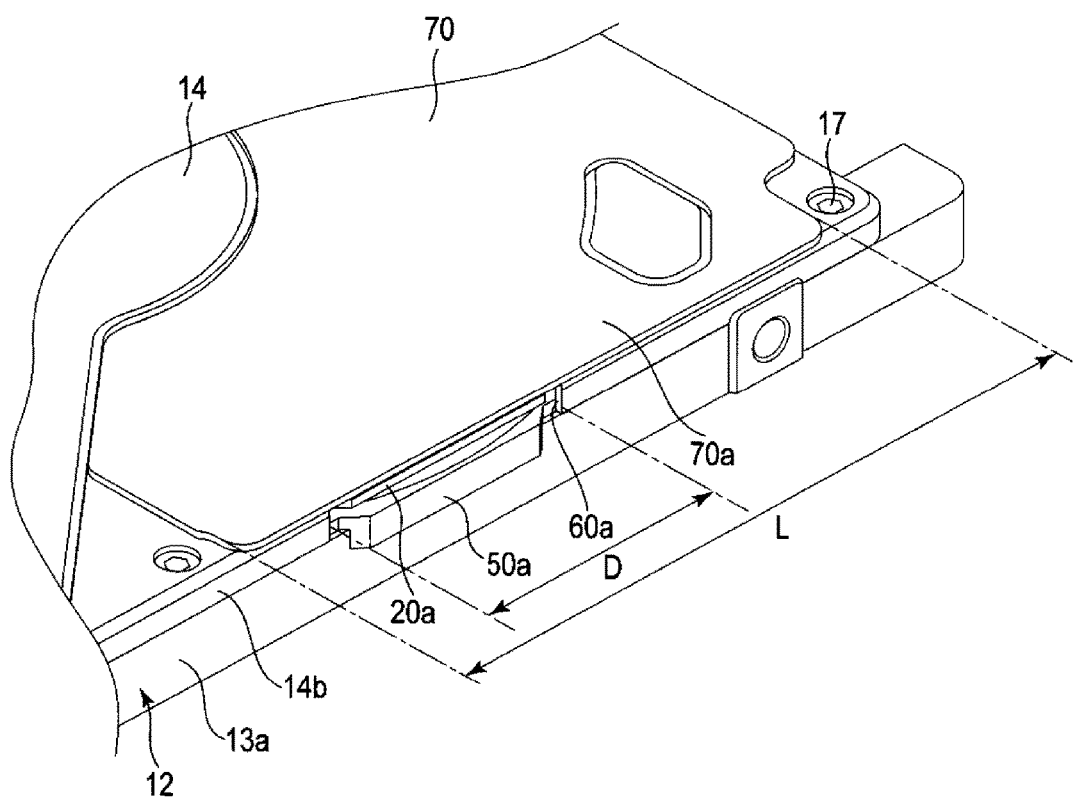
FIG. 11 is a perspective view illustrating the HDD according to the second embodiment in a partially enlarged fashion.

FIG. 10 is a perspective view illustrating an appearance of the HDD according to a second embodiment, and FIG. 11 is a perspective view illustrating the HDD in a partially enlarged fashion.

As shown in FIGS. 10 and 11, in the second embodiment, the damper 70 includes a pair of side edge portions 70a extending along long sides of the top cover 14, respectively. These side edge portions 70a are positioned to overlap regions of the gasket 20 and of the opening portions 60a of the top cover 14. A length L of each side edge portion 70a along each long side of the top cover 14 is formed at least equal to the length D of the opening portion 60a. In the present embodiment, the length L of each side edge portion 70a is set to be about 1.5 to 2 times as large as the length D of the opening portion 60a. Each side edge portion 70a extends outward away from the magnetic disk 16 to be generally flush with the long side of the top cover 14. Each side edge portion 70a is thereby positioned to entirety overlap each opening portion 60a.

In the second embodiment, other configurations of the HDD are the same as those of the HDD according to the above-described first embodiment.

According to the second embodiment, configured as described above, the side edge portions 70a of the damper can more strongly reinforce the regions near the opening portions 60a of the top cover 14. As a result, it is possible to further ensure that the top cover 14 is pressed onto the gasket 20 and improve the airtightness.

It is noted that the length L of each side edge portion 70a of the damper 70 is not limited to the length equal to or larger than the length D of the opening portion 60a but alternatively can be made smaller than the length D of the opening portion 60a. Covering at least part of the region near the opening portion 60a with each side edge portion 70 can increase the strength of the top cover 14.

Third Embodiment

Figure 12:
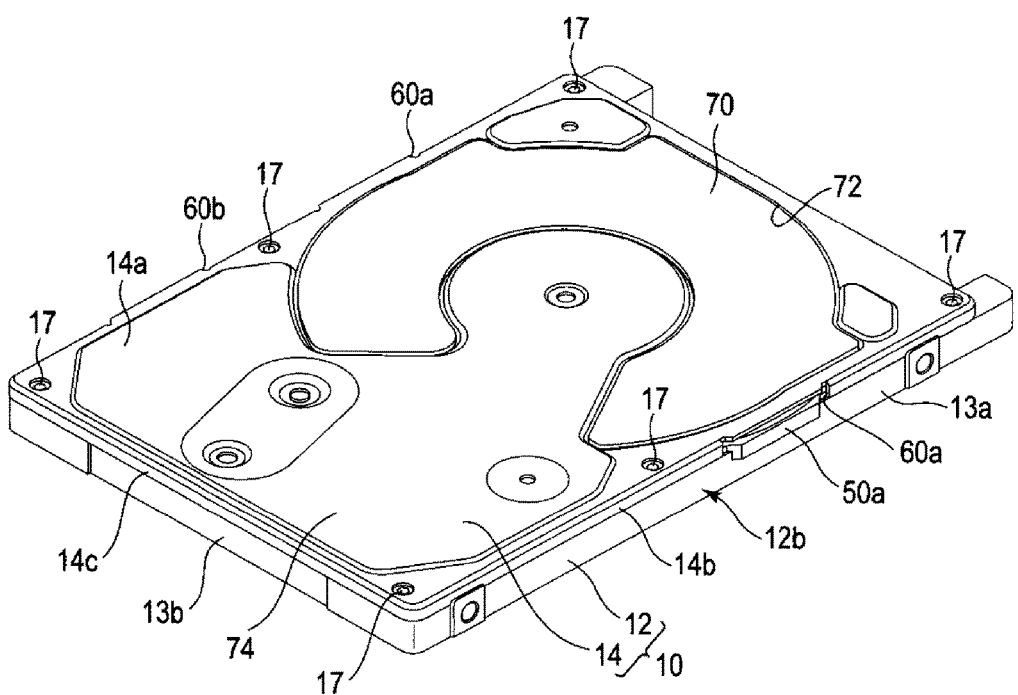
FIG. 12 is a perspective view illustrating an HDD according to a third embodiment.
Figure 13:
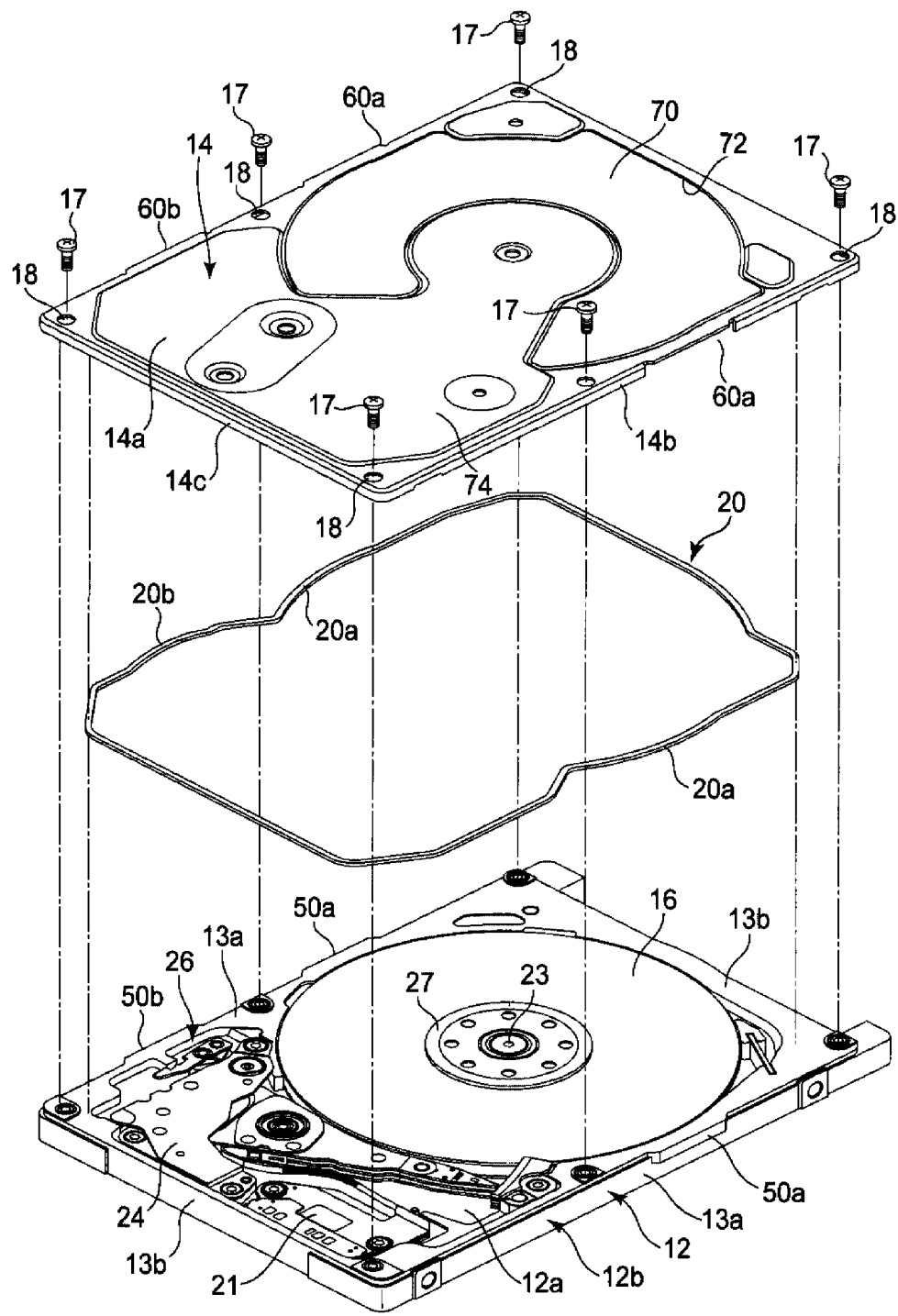
FIG. 13 is an exploded perspective view illustrating the HDD according to the third embodiment.

FIG. 12 is a perspective view illustrating the HDD according to a third embodiment, and FIG. 13 is an exploded perspective view of the HDD.

As shown in FIGS. 12 and 13, in the third embodiment, one of the long side walls 13a of the base 12 that constitutes the casing 10 includes a sidewall portion adjacent to the latch mechanism 26 and a second protruding portion 50b protruding or bulging from this sidewall portion outward from the long side wall 13a. The second protruding portion 50b is otherwise similar in configuration to the protruding portions 50a. Furthermore, a notch or a second opening portion 60b accommodating therein the second protruding portion 50b is formed in one of the long side plates 14b of the top cover 14. A shape and a size of the second opening portion 60b are similar to those of the aforementioned opening portions 60a. Moreover, the gasket 20 includes a second curved portion 20b at a position corresponding to the second protruding portion 50b of the long side wall 13a to extend to be bent or curved outward along the second protruding portion 50b. The gasket 20 thereby contacts the central portion, in the width direction, of the upper end surface of the sidewall 12b, including in the protruding portion 50b of the sidewall 12b.

Other configurations of the HDD are the same as those of the HDD according to the first embodiment.

According to the third embodiment configured as described above, positioning of the second protruding portion 50b on the long side wall 13a near the latch mechanism 26 can increase the thickness of this portion and widen the sidewall 12b of the base 12 in a range not exceeding the apparatus outer shape dimension standard. It is thereby possible to improve the castability of the base 12. Moreover, the width of the contact surface (upper end surface of the sidewall 12b) with the gasket 20 is increased, so that it is possible to improve the airtightness of the casing 10.

Fourth Embodiment

Figure 14:
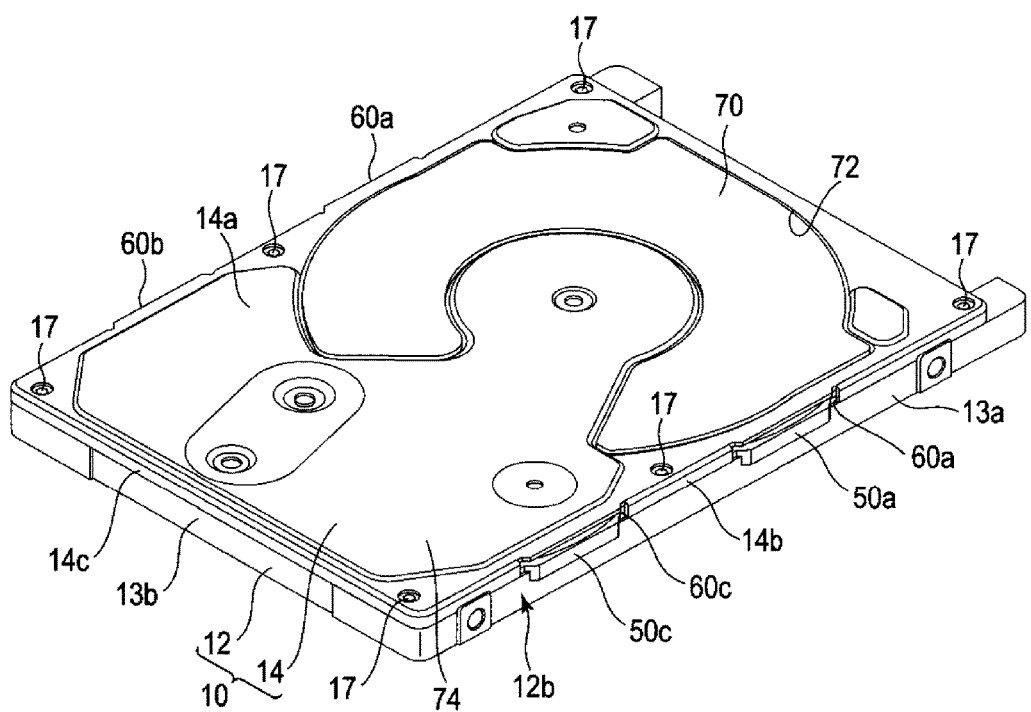
FIG. 14 is a perspective view illustrating an HDD according to a fourth embodiment.

FIG. 14 is a perspective view illustrating the HDD according to a fourth embodiment.

As shown in FIG. 14, in the fourth embodiment, one of the long side walls 13a of the base 12 that constitutes the casing 10 includes a sidewall portion adjacent to the ramp load mechanism 25 and a third protruding portion 50c protruding or bulging from this sidewall portion outward of the long side wall 13a. The third protruding portion 50c may be similar in configuration to the protruding portions 50a. Furthermore, a notch or a third opening portion 60c accommodating therein the third protruding portion 50c is formed in one of the long side plates 14b of the top cover 14. A shape and a magnitude of the third opening 60c are similar to those of the aforementioned opening portions 60a. Moreover, the gasket 20 includes a third curved portion (not shown) at a position corresponding to the third protruding portion 50c of the long side wall 13a that extends or curves outward along the third protruding portion 50c. The gasket 20 thereby contacts the central portion, in the width direction, of the upper end surface of the sidewall 12b, including in the third protruding portions 50c of the sidewall 12b.

Other configurations of the HDD are the same as those of the HDD according to the first embodiment.

According to the fourth embodiment configured as described above, positioning the third protruding portion 50c on the long side wall 13a near the ramp load mechanism 25 can increase the thickness of this portion and widen the sidewall 12b of the base 12 in a range not exceeding the apparatus outer shape dimension standard. It is thereby possible to improve the castability of the base 12. Moreover, the width of the contact surface (upper end surface of the sidewall 12b) with the gasket 20 is increased, so that it is possible to improve the airtightness of the casing 10.

The present disclosure is not limited to the above-mentioned embodiments or modifications but the present disclosure can be embodied by modifying the constituent elements without departing from the spirit of the present disclosure in implementation. Furthermore, various inventions can be embodied by combining a plurality of constituent elements disclosed in the above-mentioned embodiments as appropriate. For example, some of the constituent elements may be deleted from all the constituent elements described in the embodiments. Moreover, the constituent elements across the different embodiments may be combined as appropriate.

In the first embodiment described above, the protruding portion of the base is disposed on each of the pair of long side wall; however, the present disclosure is not limited to the first embodiment, and the protruding portion may be disposed only on one long side wall. In this case, it is similarly possible to achieve improvement in the castability and the airtightness of the casing 10. Moreover, in the second embodiment and the third embodiment, the protruding portion may be the second protruding portion only or the third protruding portion only.

The number of the magnetic disks is not limited to one but may be two or more, and the number of the magnetic heads may be also increased or decreased in response to the number of the magnetic disks included in the HDD. The size of the magnetic disk is not limited to 2.5 inches but may be the other size. Materials, shapes, magnitudes, and the like of the constituent elements of the disk apparatus are not limited to those in the above-mentioned embodiments but can be variously changed as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk apparatus, comprising:
   a base including a bottom wall and a sidewall disposed along a peripheral portion of the bottom wall;
   a cover including a ceiling plate and a side plate disposed along a periphery of the ceiling plate, the ceiling plate being fixed to the sidewall and the side plate facing an outer surface of the sidewall; and
   a rotatable recording medium disposed between the cover and the bottom wall, wherein
   the sidewall of the base includes a first portion adjacent to the recording medium and a protruding portion that protrudes from the first portion outward and away from the recording medium, and at least a portion of a sidewall of the protruding portion faces an opening formed in the side plate.

2. The disk apparatus according to claim 1, wherein
   the opening formed in the side plate has a length that is greater than a length of the protruding portion and is positioned to accommodate the protruding portion.

3. The disk apparatus according to claim 1, wherein the sidewall of the base includes a pair of long side walls facing each other and a pair of short side walls facing each other, and at least one of the long side walls includes the protruding portion.

4. The disk apparatus according to claim 3, wherein
   one of the pair of long side walls includes the protruding portion, the other of the pair of long side walls includes a second protruding portion that protrudes from the sidewall of the base, and the cover includes a pair of openings that are each formed in the side plate and configured to accommodate one of the protruding portion and the second protruding portion.

5. The disk apparatus according to claim 3, wherein
   the pair of long side walls are each positioned in a longitudinal direction and the protruding portion is disposed along a straight line that passes through a center of the recording medium and is perpendicular to the longitudinal direction.

6. The disk apparatus according to claim 1, further comprising
   a sealing member that is disposed between the ceiling plate of the cover and an upper end surface of the sidewall and includes a curved portion that is in contact with the protruding portion.

7. The disk apparatus according to claim 1, further comprising a plate-like damper disposed on the ceiling plate.

8. The disk apparatus according to claim 7, wherein
   the damper includes a side edge portion positioned to overlap at least a portion of a sealing member that is disposed between the ceiling plate of the cover and an upper end surface of the sidewall and includes a curved portion that is in contact with the protruding portion.

9. The disk apparatus according to claim 7, wherein
   the damper includes a side edge portion that is disposed adjacent to the opening and has a length that extends along a side of the ceiling plate, the length of the side edge portion being larger than a length of the opening.

10. The disk apparatus according to claim 7, further comprising a sealing member disposed between the ceiling plate of the cover and an upper end surface of the sidewall, wherein the damper includes a side edge portion that is positioned to extend parallel to the sealing member proximate the opening.

11. The disk apparatus according to claim 10, wherein the ceiling plate of the cover includes a recess portion recessed toward the base and the damper is disposed in the recess portion.

12. The disk apparatus according to claim 11, wherein the recess portion includes a bent side edge portion formed into a circular arc shape concentric with a curved portion of the sealing member that curves outward away from the recording medium and extends along the protruding portion.

13. The disk apparatus according to claim 10, wherein the sealing member includes a curved portion that curves outward away from the recording medium and extends along the protruding portion.

14. The disk apparatus according to claim 13, wherein the side edge portion is disposed in parallel to the sealing member near the opening, and a part of the side edge portion is formed into a circular arc shape concentric with the curved portion of the sealing member.

15. The disk apparatus according to claim 1, further comprising:
a head for magnetically reading data from or writing data to the recording medium;
a carriage assembly supporting the head so that the head is movable relative to the recording medium; and
a latch mechanism for latching the carriage assembly, wherein
the sidewall of the base includes a second portion located adjacent to the latch mechanism and a second protruding portion protruding from the second portion outward and away from the recording medium, and
the side plate of the cover includes a second opening that accommodates the second protruding portion.

16. The disk apparatus according to claim 1, further comprising:
a head for magnetically writing data to or reading data from the recording medium; and
a ramp load mechanism for holding the head at a position away from the recording medium, wherein
the sidewall of the base includes a second portion located adjacent to the ramp load mechanism and a second protruding portion protruding from the second portion outward and away from the recording medium, and
the side plate of the cover includes a second opening that accommodates the second protruding portion.

17. A disk apparatus, comprising:
a base including a bottom wall and a sidewall disposed along a peripheral portion of the bottom wall;
a cover including a ceiling plate and a side plate disposed along a periphery of the ceiling plate, the ceiling plate being fixed to the sidewall and the side plate facing an outer surface of the sidewall;
and
a rotatable recording medium disposed between the cover and the bottom wall, wherein
the sidewall of the base includes a pair of long side walls facing each other and a pair of short side walls facing each other, at least one of the long side walls includes a protruding portion that protrudes outward and away from the recording medium, and at least a portion of a sidewall of the protruding portion faces an opening formed in the side plate.

18. The disk apparatus according to claim 17, further comprising
a sealing member that is disposed between the ceiling plate of the cover and an upper end surface of the sidewall and includes a curved portion that is in contact with the protruding portion.

19. The disk apparatus according to claim 17, further comprising a plate-like damper disposed on the ceiling plate.

20. The disk apparatus according to claim 19, wherein the damper includes a side edge portion positioned to overlap at least a portion of a sealing member that is disposed between the ceiling plate of the cover and an upper end surface of the sidewall and includes a curved portion that is in contact with the protruding portion.

* * * * *